United States Patent
Chen et al.

(10) Patent No.: US 12,426,192 B2
(45) Date of Patent: Sep. 23, 2025

(54) MAIN BOARD ASSEMBLY

(71) Applicant: ASUSTEK COMPUTER INC., Taipei (TW)

(72) Inventors: Po-Ting Chen, Taipei (TW); Chang-Hung Chen, Taipei (TW); Chih-Hung Chuang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 187 days.

(21) Appl. No.: 18/480,962

(22) Filed: Oct. 4, 2023

(65) Prior Publication Data

US 2024/0407121 A1 Dec. 5, 2024

(30) Foreign Application Priority Data

May 31, 2023 (TW) .................................. 112120341

(51) Int. Cl.
*G06F 1/18* (2006.01)
*H05K 7/14* (2006.01)

(52) U.S. Cl.
CPC ........... *H05K 7/1417* (2013.01); *G06F 1/185* (2013.01)

(58) Field of Classification Search
CPC ........... G06F 1/183; G06F 1/185; G06F 1/186
See application file for complete search history.

(56) References Cited

U.S. PATENT DOCUMENTS

| | | | |
|---|---|---|---|
| 7,649,752 B2 * | 1/2010 | Tsorng | G06F 1/185 361/802 |
| 9,268,360 B2 * | 2/2016 | Weng | G11B 33/08 |
| 9,629,291 B1 * | 4/2017 | Chen | G06F 1/186 |
| 11,853,131 B2 * | 12/2023 | Chen | H05K 7/1402 |
| 11,868,187 B2 * | 1/2024 | Chen | G06F 1/185 |
| 2008/0165487 A1 | 7/2008 | Tsorng et al. | |
| 2023/0251695 A1 * | 8/2023 | Chen | H05K 7/1402 361/801 |
| 2023/0396022 A1 * | 12/2023 | Chen | H01R 12/737 |

FOREIGN PATENT DOCUMENTS

| | | |
|---|---|---|
| CN | 202257395 U | 5/2012 |
| CN | 113407010 A | 9/2021 |
| CN | 214846545 U | 11/2021 |
| TW | 547806 U | 8/2003 |
| TW | M314999 U | 7/2007 |
| TW | M419374 U | 12/2011 |

* cited by examiner

Primary Examiner — Adrian S Wilson
(74) Attorney, Agent, or Firm — MUNCY, GEISSLER, OLDS & LOWE, P.C.

(57) ABSTRACT

A main board assembly adapted to mount an expansion element is provided. The expansion element includes an electrical connection portion. One end of the electrical connection portion includes a buckling portion. The main board assembly includes a main board, a shielding board, and an operating member. The main board includes a slot and a buckling member. The slot is adapted for insertion of the electrical connection portion. The buckling member is movably disposed at one end of the slot, and is adapted to buckle the buckling portion. The shielding board is disposed on one side of the main board and includes an opening. The operating member includes a first end and a second end. The first end is coupled to the buckling member, and the second end extends through the opening to one side of the shielding board away from the main board.

11 Claims, 10 Drawing Sheets

MAIN BOARD ASSEMBLY

CROSS-REFERENCE TO RELATED APPLICATION

This application claims the priority benefit of Taiwan application serial No. 112120341, filed on May 31, 2023. The entirety of the above-mentioned patent application is hereby incorporated by reference herein and made a part of the specification.

BACKGROUND OF THE INVENTION

Field of the Invention

The disclosure relates to a main board assembly, and in particular, to a main board assembly for mounting an expansion element.

Description of the Related Art

Slots are provided on main boards on the market for users to mount expansion cards (such as graphics cards) for expansion.

At present, a graphics card release structure (commonly known as a whale tail release structure) is disposed next to the graphics card slot. Users release and lift the graphics card by turning the graphics card release structure, to facilitate dismounting and mounting of the graphics card. However, as elements and specifications in a case increase (including peripheral devices of the main board) (in an embodiment: the volume of a tower radiator of a central processing unit increases, and the size of a cooling element increases), the graphics card release structure is blocked, resulting in difficulty in operation for users.

BRIEF SUMMARY OF THE INVENTION

The disclosure provides a main board assembly, adapted to mount an expansion element. The expansion element includes an electrical connection portion. One end of the electrical connection portion includes a buckling portion. The main board assembly includes a main board, a shielding board, and an operating member. The main board includes a slot and a buckling member. The slot is adapted for insertion of the electrical connection portion. The buckling member is movably disposed at one end of the slot, and is adapted to buckle the buckling portion. The shielding board is disposed on one side of the main board and includes an opening. The operating member includes a first end and a second end. The first end is coupled to the buckling member, and the second end extends through the opening to one side of the shielding board away from the main board.

The main board assembly provided in the disclosure includes an operating member. The operating member is coupled to the buckling member at one end of the slot, and extends through the opening of the shielding board to the side of the shielding board away from the main board. In this way, a user drives the buckling member through the operating member from the outside of the case to release the expansion element, to resolve the problem of difficulty in operation for users because the conventional graphics card release structure is blocked by other elements in the case or on the main board.

DETAILED DESCRIPTION OF THE EMBODIMENTS

The following describes specific implementations of the disclosure in more detail with reference to drawings. According to the following description and scope of patent application, advantages and characteristics of the disclosure will be clearer. It is to be noted that, drawings adopt a very simplified form and use a non-precise proportion, and are only used for conveniently and clearly illustrating embodiments of the disclosure.

Figure 1:
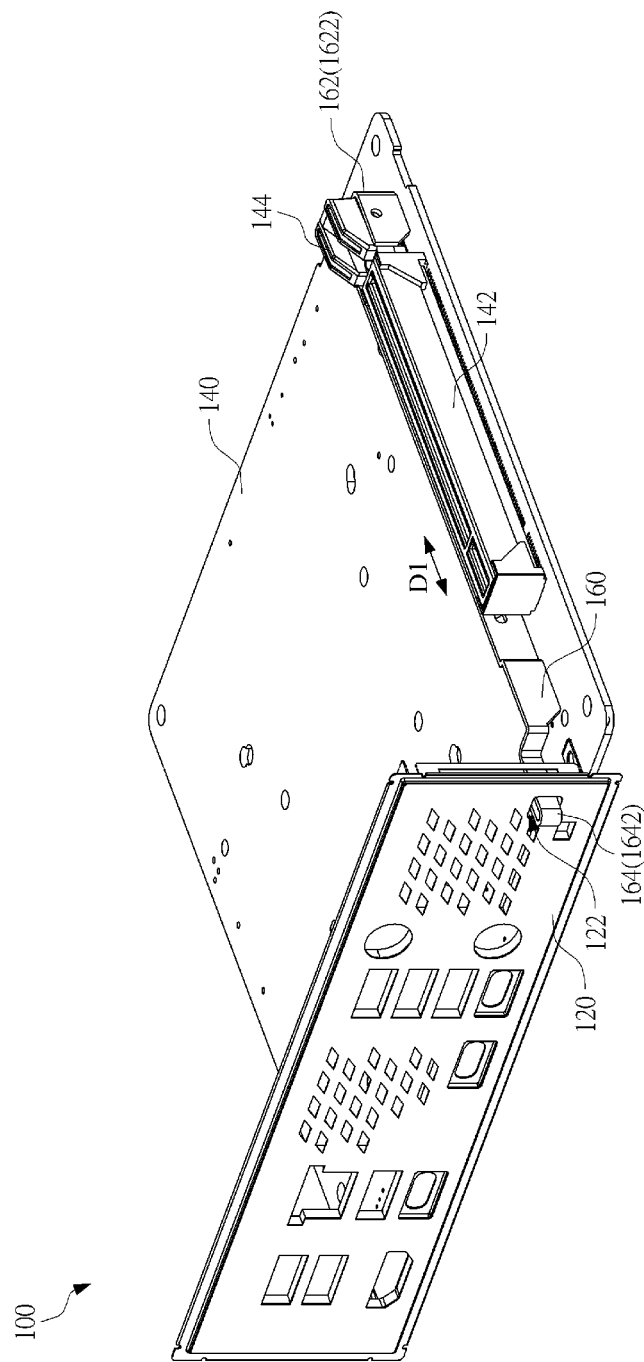
FIG. 1 is a schematic diagram of a main board assembly according to an embodiment of the disclosure.
Figure 2:
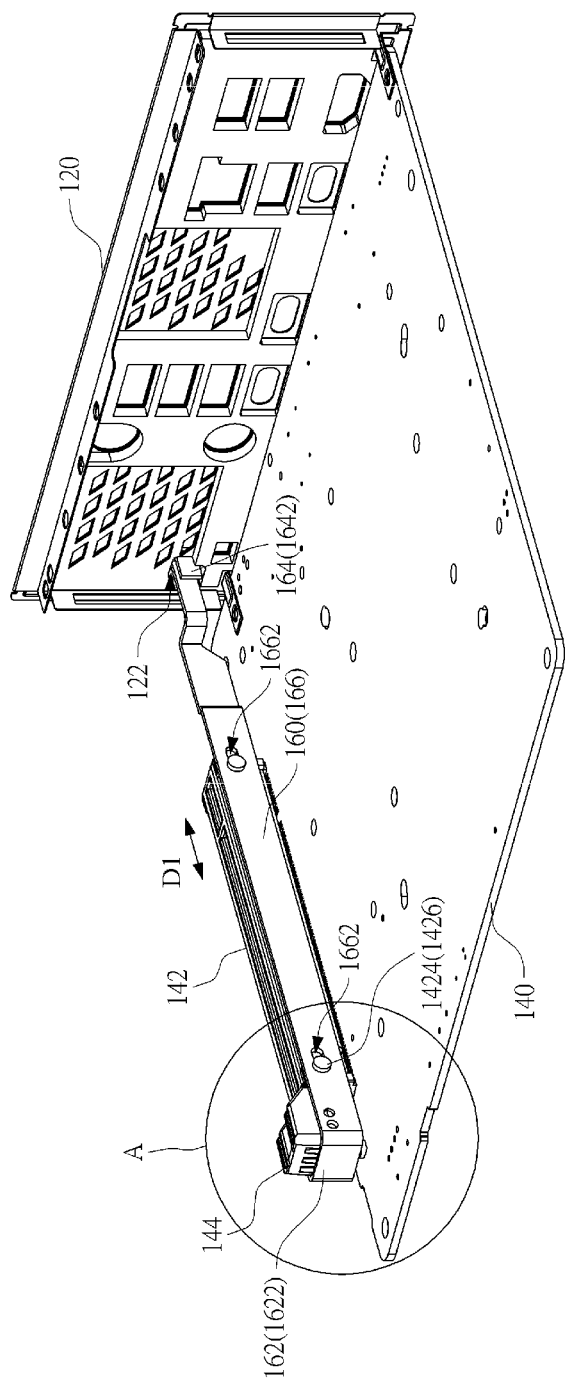
FIG. 2 is a schematic diagram of the main board assembly in FIG. 1 corresponding to another angle of view.

FIG. 1 is a schematic diagram of a main board assembly 100 according to an embodiment of the disclosure. FIG. 2 is a schematic diagram of the main board assembly 100 in FIG. 1 corresponding to another angle of view. The main board assembly 100 is disposed in a computer host or a case of a server.

As shown in the figure, the main board assembly 100 of the disclosure includes a shielding board 120, a main board 140, and an operating member 160.

The shielding board 120 includes an opening 122. The shielding board 120 is fixed on the case (not shown in the drawing). The opening 122 penetrates the shielding board 120 to connect an inner side and an outer side of the case. The shielding board 120 is mounted on the front or the back of the case, or other positions suitable for a user to operate. In an embodiment, the shielding board 120 is mounted on the back of the case.

The shielding board 120 is disposed on one side of the main board 140. The main board 140 includes a slot 142 and a buckling member 144. The slot 142 is adapted for insertion of an expansion element. The buckling member 144 is movably disposed at one end of the slot 142 and is adapted to buckle and position the expansion element. In an embodiment, the slot 142 is a PCIE interface slot for mounting a PCIE interface expansion element. In an embodiment, the buckling member 144 is disposed at one end of the slot 142 away from the opening 122.

Figure 3:
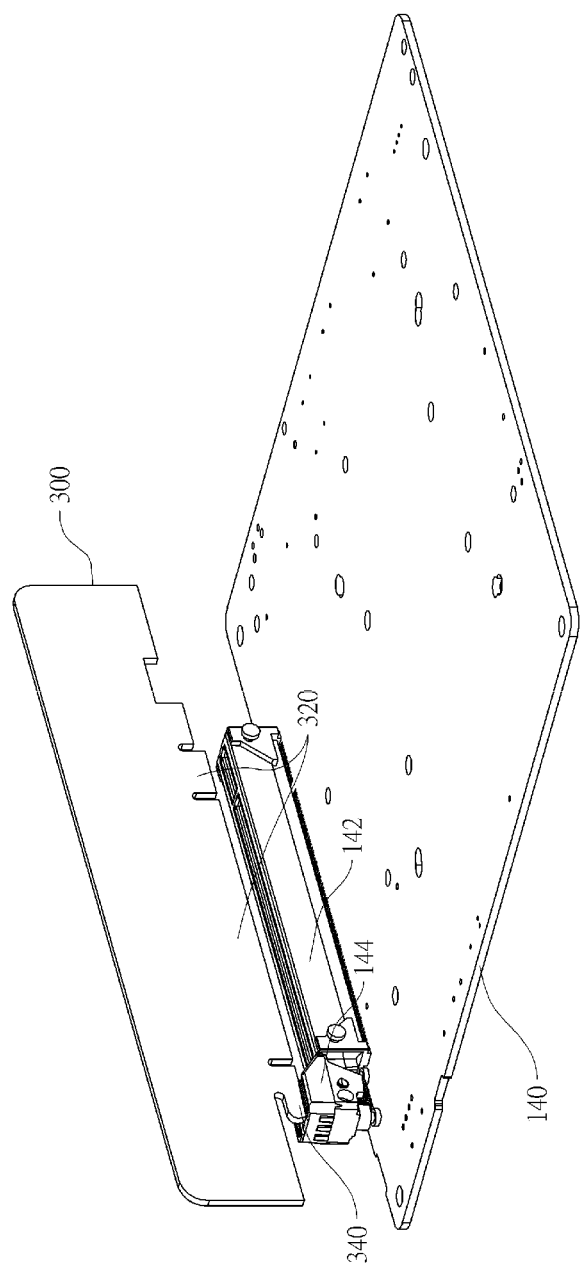
FIG. 3 is a schematic diagram of an expansion element mounted in the main board assembly of the disclosure.

Refer to FIG. 3 together. FIG. 3 is a schematic diagram of an expansion element 300 mounted in the main board assembly 100 of the disclosure. As shown in the figure, one side of the expansion element 300 includes an electrical connection portion 320. The electrical connection portion 320 is inserted into the slot 142 on the main board 140. One end of the electrical connection portion 320 is disposed with a buckling portion 340 for buckling the buckling member 144 to be positioned on the main board 140. In an embodiment, the buckling portion 340 is a hook. In an embodiment, the expansion element 300 is an expansion card, such as a graphics card, a wireless communication card, or an expansion memory. In an embodiment, the expansion card is a PCIE interface expansion card.

Figure 4:
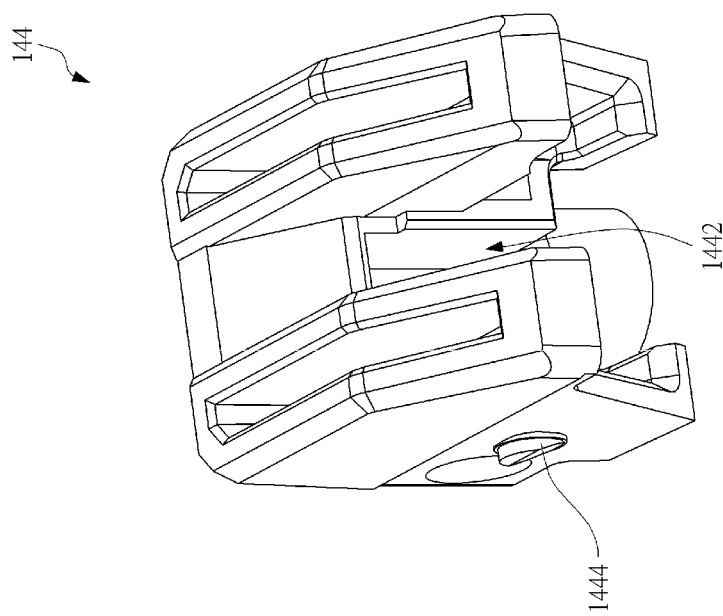
FIG. 4 is an enlarged view of area A in FIG. 2.

Refer to FIG. 4 together. FIG. 4 is an enlarged view of the buckling member 144 in FIG. 1. As shown in the figure, one side of the buckling member 144 facing the slot 142 includes a groove 1442. The groove 1442 corresponds to the buckling portion 340 on the expansion element 300. When the electrical connection portion 320 of the expansion element 300 is inserted into the slot 142, the buckling portion 340 of the expansion element 300 is buckled in the groove 1442. In this way, the expansion element 300 is locked to prevent the expansion element 300 from leaving the slot 142.

Refer to FIG. 1 and FIG. 2 again. The operating member 160 includes a first end 162 and a second end 164. The first end 162 is coupled to the buckling member 144 on the main board 140, and the second end 164 extends through the opening 122 on the shielding board 120 from one side of the shielding board 120 facing the main board 140 (that is, the inside of the case) to one side of the shielding board 120 away from the main board 140 (that is, the outside of the case). The user controls the action of the buckling member 144 through the operating member 160 through the side of the shielding board 120 away from the main board 140. The operating member 160 as a whole is presented as a bent strip structure to match the positions of the opening 122 and the slot 142.

In this embodiment, the operating member 160 and the buckling member 144 are two independent elements coupled to each other. In other embodiments, the operating member 160 and the buckling member 144 are also integrally formed.

A middle section 166 of the operating member 160 extends along a side surface of the slot 142, and the slot 142 includes a guide structure 1424 at a position corresponding to the middle section 166, for guiding the operating member 160 to move along a first direction D1. The guide structure 1424 is helpful to ensure that an external force applied by the user on the second end 164 is smoothly applied to the buckling member 144 through the operating member 160.

In an embodiment, as shown in the figure, the guide structure 1424 includes a plurality of protrusions 1426. Corresponding to the protrusions 1426, a plurality of sliding slots 1662 is provided on the operating member 160. The protrusions 1426 respectively extend into the corresponding sliding slots 1662 to limit a moving direction of the operating member 160. In an embodiment, the operating member 160 is guided by the guide structure 1424 to move along the first direction D1. The first direction D1 is parallel to a long-side direction of the slot 142 and parallel to a surface of the main board 140.

Because the main board 140 includes other structural members in addition to the slot 142, in other embodiments, other structural members on the main board 140, such as a thermal dissipation sheet, a fan frame, are alternatively used to guide the operating member 160. Specifically, the guide structure 1424 is disposed on one side of these structural members facing the operating member 160 to guide the operating member 160 to move along the first direction D1.

In this embodiment, the protrusion 1426 on the side surface of the slot 142 is used to match the sliding slot 1662 on the operating member 160 to guide the moving direction of the operating member 160. The guide structure 1424 disposed on the slot 142 is not limited to the protrusion 1426.

In an embodiment, a sliding slot is also formed on the side surface of the slot 142 as the guide structure 1424 to guide the operating member 160.

Figure 5:
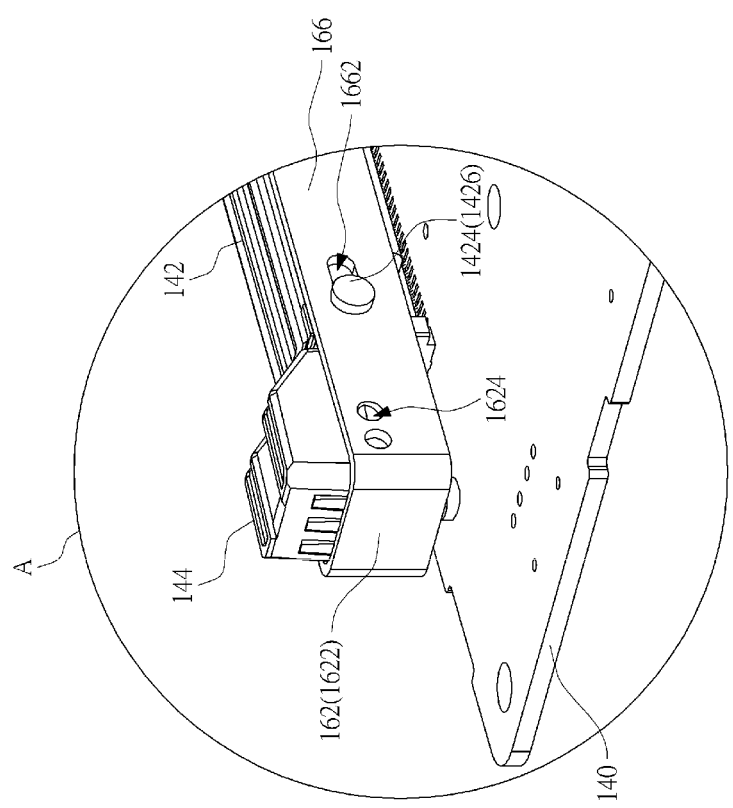
FIG. 5 is a schematic diagram of a buckling member in FIG. 4 corresponding to another angle of view.
Figure 6:
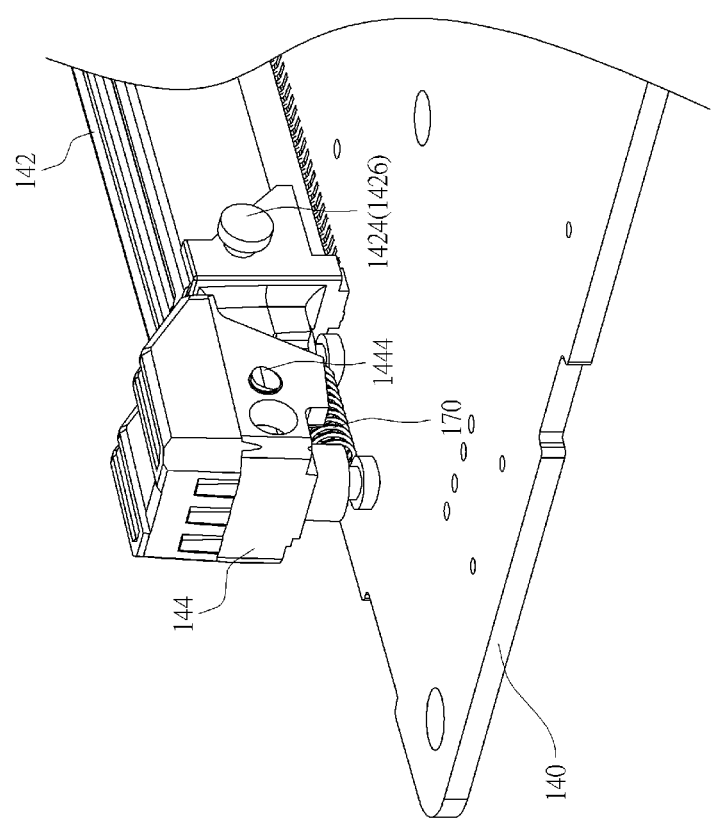
FIG. 6 is a diagram in which an operating member in FIG. 4 is removed to show relative positions of a buckling member and a slot.

Refer to FIG. 5 and FIG. 6 together. FIG. 5 is an enlarged view of area A in FIG. 2, and FIG. 6 is a diagram in which the operating member 160 in FIG. 5 is removed to show relative positions of the buckling member 144 and the slot 142.

In an embodiment, as shown in the figure, the first end 162 includes a first U-shaped structure 1622. A notch of the first U-shaped structure 1622 faces the buckling member 144, and two opposite sides of the first U-shaped structure 1622 each include a pivot hole 1624. A side surface of the buckling member 144 includes a protruding structure 1444. The protruding structure 1444 is inserted into the pivot hole 1624 so that the buckling member 144 is pivotally connected to the first end 162 of the operating member 160.

A bottom of the buckling member 144 is coupled to a body of the main board 140. When the operating member 160 is guided by the guide structure 1424 to move along the first direction D1, the operating member 160 drives the buckling member 144 through the pivot hole to rotate 1624 to lock the expansion element 300 or release and lift the expansion element 300.

Specifically, when the expansion element 300 is inserted into the slot 142, the buckling member 144 is buckled to the buckling portion 340 of the expansion element 300 to lock the expansion element 300. When the expansion element 300 needs to be removed, the buckling member 144 is released by rotating to lift the expansion element 300.

In addition, in order to make it convenient for the user to mount the expansion element 300, to ensure that when the expansion element 300 is inserted into the slot 142, the buckling member 144 is smoothly buckled to the buckling portion 340 of the expansion element 300, in this embodiment, an elastic element 170 is disposed between the first end 162 of the operating member 160 and the slot 142. In an embodiment, the elastic element 170 is a tension spring.

Because the first end 162 of the operating member 160 is coupled to the movable buckling member 144, and the slot 142 is fixed on the main board 140, an elastic restoring force of the elastic element 170 drives the buckling member 144 to maintain in a locked state when the buckling member 144 is not driven by an external force.

In this embodiment, the elastic element 170 is disposed between the first end 162 of the operating member 160 and the slot 142 to drive the buckling member 144. In other embodiments, the elastic element 170 is alternatively disposed between the slot 142 and the buckling member 144. Moreover, in other embodiments, in addition to the elastic element 170, another elastic element (not shown in the drawing) is also disposed between the second end 164 of the operating member 160 and the shielding board 120. The elastic element maintains the second end 164 of the operating member 160 at a corresponding position when the buckling member 144 is in a locked state.

Refer to FIG. 1 and FIG. 2 again. In an embodiment, the second end 164 of the operating member 160 includes a second U-shaped structure 1642. The protruding part of the second U-shaped structure 1642 forms a pressing portion, which is convenient for the user to operate.

Figure 7:
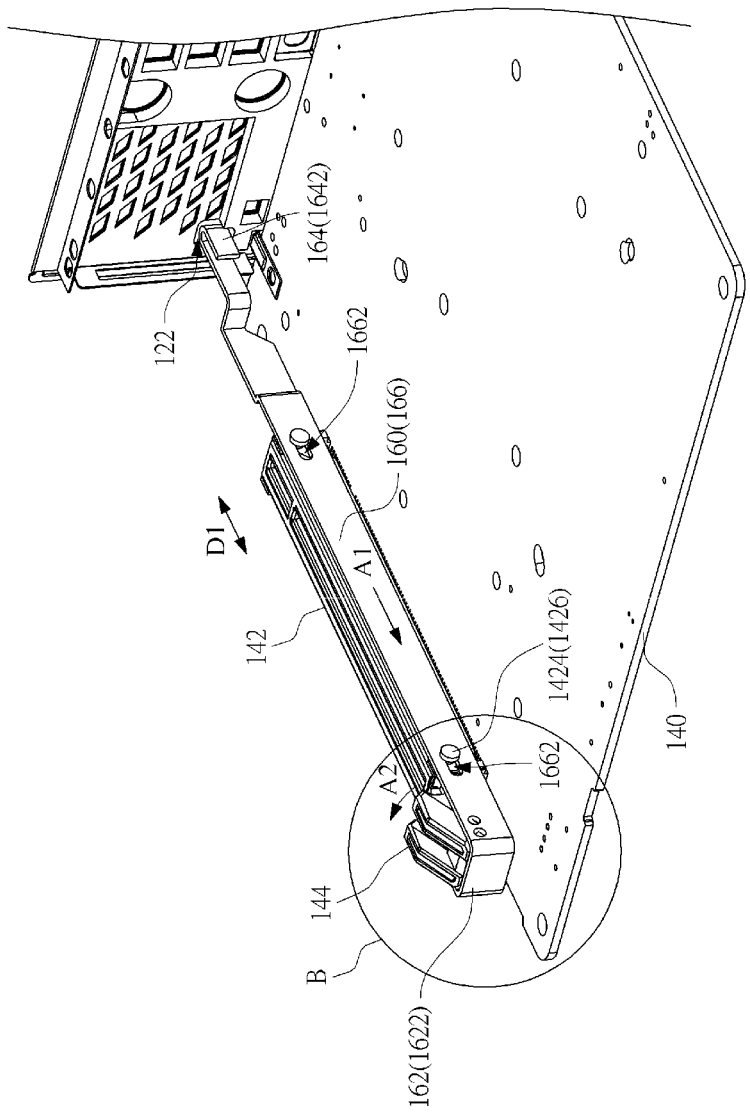
FIG. 7 is a schematic structural diagram of the main board assembly in a released state according to an embodiment of the disclosure.
Figure 8:
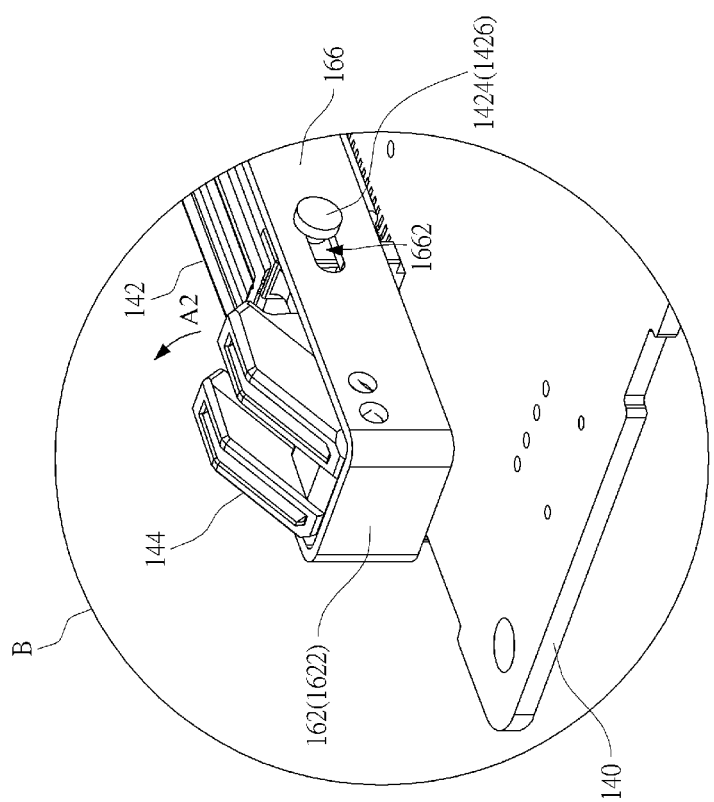
FIG. 8 is an enlarged view of area B in FIG. 7.

Refer to FIG. 7 and FIG. 8. FIG. 7 is a schematic structural diagram of the main board assembly 100 in a released state according to an embodiment of the disclosure, and FIG. 8 is an enlarged view of area B in FIG. 7.

When a user needs to remove the expansion element 300, the user presses the second end 164 of the operating member 160 from the side of the shielding board 120 away from the main board 140 (that is, the outside of the case), so that the first end 162 of the operating member 160 moves away from the slot 142 (as shown by arrow A1 in the figure).

In this case, the first end 162 of the operating member 160 drives the buckling member 144 to rotate along a direction of an arrow in the figure (as shown by arrow A2 in the figure), so that the buckling member 144 leaves the buckling portion 340 of the expansion element 300 to release the expansion element 300. At the same time, the buckling member 144 abuts against the expansion element 300 to lift the expansion element 300, which is convenient for the user to dismount and mount the expansion element 300.

Figure 9:
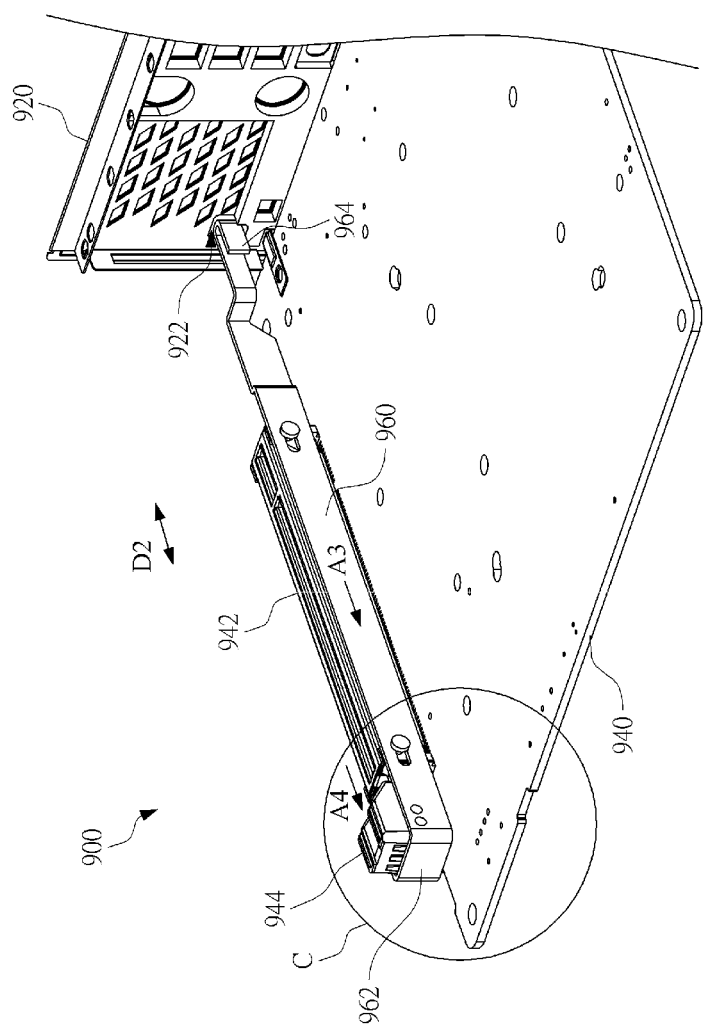
FIG. 9 is a schematic structural diagram of the main board assembly in a released state according to an embodiment of the disclosure.
Figure 10:
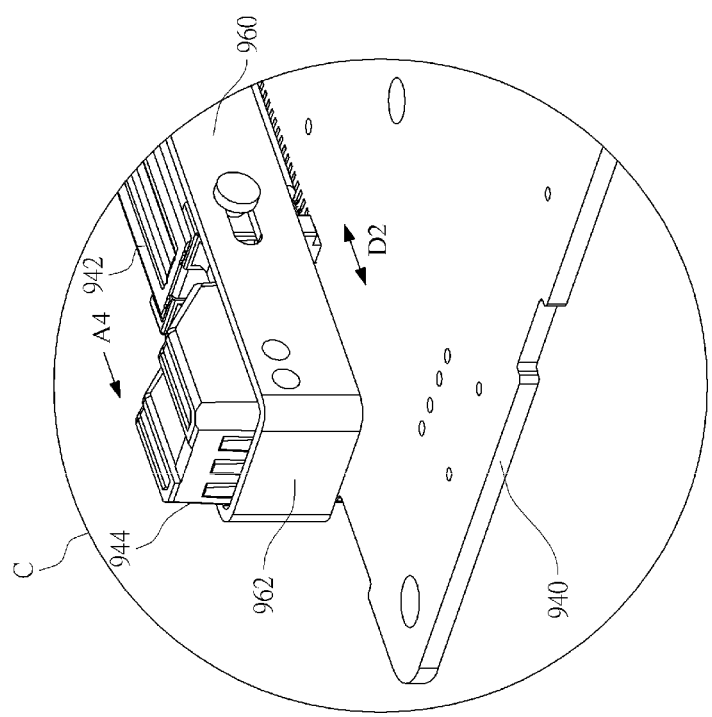
FIG. 10 is an enlarged view of area C in FIG. 9.

Refer to FIG. 9 and FIG. 10. FIG. 9 is a schematic structural diagram of the main board assembly 900 in a released state according to another embodiment of the disclosure, and FIG. 10 is an enlarged view of area C in FIG. 9.

In the embodiment shown in FIG. 7 and FIG. 8, the state (that is, the locked state or the released state) of the buckling member 144 is changed through rotation.

As shown in the figure, in this embodiment, a buckling member 944 is movably disposed on a main board 940 along a horizontal direction D2. The state (that is, the locked state or the released state) of the buckling member 944 is changed through back-and-forth movement relative to a slot 942. A first end 962 of an operating member 960 is coupled to the buckling member 944 to drive the buckling member 944 to move. In an embodiment, the second direction D1 is parallel to a long-side direction of the slot 942 and parallel to a surface of the main board 940. In an embodiment, the buckling member 944 is fixed on the first end 962 of the operating member 960 and moves along with the operating member 960.

When a user needs to remove the expansion element 300, the user presses a second end 964 of the operating member 960 through an opening 922 from one side of a shielding board 920 away from the main board 940 (that is, the outside of the case), so that the first end 962 moves away from the slot 942 (as shown by arrow A3 in the figure), and then drives the buckling member 944 to move (as shown by arrow A4 in the figure). In this way, the buckling member 944 leaves a buckling portion 340 of the expansion element 300 to release the expansion element 300, which is convenient for the user to dismount and mount the expansion element 300.

The main board assemblies 100 and 900 provided in the disclosure include the operating members 160 and 960. The operating members 160 and 960 are coupled to the buckling members 144 and 944 at one end of the slots 142 and 942, and extend through the openings 122 and 922 of the shielding boards 120 and 920 to one side of the shielding boards 120 and 920 away from the main boards 140 and 940. In this way, a user drives the buckling members 144 and 944 through the operating members 160 and 960 from the outside of the case to release the expansion element 300, to resolve the problem of difficulty in operation for users because the conventional graphics card release structure is blocked by other elements in the case or on the main board 140.

The above is only an exemplary embodiment of the disclosure, and does not limit the disclosure. Variations such as equivalent replacements or modifications in any form made by any person skilled in the art to the technical means and technical contents disclosed in the disclosure without departing from the technical means of the disclosure are contents not departing from the technical means of the disclosure and still fall within the protection scope of the disclosure.

What is claimed is:

1. A main board assembly, adapted to mount an expansion element, wherein the expansion element comprises an electrical connection portion, one end of the electrical connection portion comprises a buckling portion, and the main board assembly comprises:
    a main board, comprising a slot, wherein the slot is adapted for insertion of the electrical connection portion;
    a shielding board, disposed on one side of the main board and comprising an opening;
    a buckling member, movably disposed at one end of the slot, and adapted to buckle the buckling portion; and
    an operating member, comprising a first end and a second end, wherein the first end is coupled to the buckling member, and the second end extends through the opening to one side of the shielding board away from the main board.

2. The main board assembly according to claim 1, wherein the buckling member is rotatably disposed at one end of the slot.

3. The main board assembly according to claim 1, wherein the buckling member is movably disposed at one end of the slot along a horizontal direction.

4. The main board assembly according to claim 1, further comprising an elastic element, wherein the elastic element is connected to the slot and the first end.

5. The main board assembly according to claim 1, further comprising an elastic element, wherein the elastic element is connected to the slot and the buckling member.

6. The main board assembly according to claim 1, wherein the expansion element is a PCIE expansion element.

7. The main board assembly according to claim 1, wherein a side surface of the slot comprises a guide structure for guiding the operating member to move along a first direction.

8. The main board assembly according to claim 7, wherein the first direction is parallel to a surface of the main board.

9. The main board assembly according to claim 1, wherein the main board includes a structural member, wherein one side of the structural member facing the operating member comprises a guide structure for guiding the operating member to move along a first direction.

10. The main board assembly according to claim 1, wherein the buckling member is movably disposed at one end of the slot away from the opening.

11. The main board assembly according to claim 1, wherein the operating member and the buckling member are integrally formed.

* * * * *